(12) United States Patent
Waller (10) Patent No.: US 8,490,036 B2
(45) Date of Patent: *Jul. 16, 2013

(54) SYSTEM AND TECHNIQUE OF PATTERN MATCHING AND PATTERN REPLACEMENT

(75) Inventor: Mark Waller, Bristol (GB)

(73) Assignee: Pulsic Limited (GB)

( * ) Notice: Subject to any disclaimer, the term of this patent is extended or adjusted under 35 U.S.C. 154(b) by 407 days.

This patent is subject to a terminal disclaimer.

(21) Appl. No.: 12/689,150

(22) Filed: Jan. 18, 2010

(65) Prior Publication Data

US 2010/0122227 A1  May 13, 2010

Related U.S. Application Data (63) Continuation of application No. 11/275,726, filed on Jan. 25, 2006, now Pat. No. 7,657,852.

(60) Provisional application No. 60/595,915, filed on Aug. 16, 2005.

(51) Int. Cl.
*G06F 17/50* (2006.01)

(52) U.S. Cl.
USPC .......................................... 716/106; 716/110

(58) Field of Classification Search
USPC ................................. 716/106–110
See application file for complete search history.

(56) References Cited

U.S. PATENT DOCUMENTS

| | | | |
|---|---|---|---|
| 5,794,239 A | 8/1998 | Walster et al. | |
| 6,009,250 A | 12/1999 | Ho et al. | |
| 6,077,310 A | 6/2000 | Yamamoto et al. | |
| 6,892,367 B2 | 5/2005 | Palusinski et al. | |
| 6,892,368 B2 | 5/2005 | Li et al. | |
| 7,657,852 B2 * | 2/2010 | Waller | 716/119 |
| 2003/0115569 A1 | 6/2003 | Ikeuchi | |
| 2006/0036977 A1 | 2/2006 | Cohn et al. | |

FOREIGN PATENT DOCUMENTS

| | | |
|---|---|---|
| JP | 03018052 | 1/1991 |
| JP | 05120375 | 5/1993 |
| WO | 0165315 | 9/2001 |

\* cited by examiner

*Primary Examiner* — Vuthe Siek
*Assistant Examiner* — Binh Tat
(74) *Attorney, Agent, or Firm* — Aka Chan LLP (57) ABSTRACT

A system and technique to specifies patterns to search for in an integrated circuit layout, and specifies proposed replacement patterns. A description file includes specifications for one or more patterns to be searched for. In the description file, for each pattern, there may be one or more proposed replacement patterns. The description file is read. Pattern matches, if any, in a layout are found. A proposed replacement pattern is tested in place of a matched pattern. If acceptable, the proposed pattern may be used to replace the matched pattern.

20 Claims, 4 Drawing Sheets

SYSTEM AND TECHNIQUE OF PATTERN MATCHING AND PATTERN REPLACEMENT

CROSS-REFERENCE TO RELATED APPLICATIONS

This patent application is a continuation of U.S. patent application Ser. No. 11/275,726 filed Jan. 25, 2006, which claims priority to U.S. provisional application 60/595,915, filed Aug. 16, 2005, which are incorporated by reference along with all other references cited in this application.

BACKGROUND OF THE INVENTION

The present invention relates to electronic design automation for electronic circuits, and in particular, to techniques for specifying patterns to search for in an integrated circuit layout and proposing replacement patterns.

Integrated circuits are important building blocks of the information age and are critical to the information age, affecting every industry including financial, banking, legal, military, high technology, transportation, telephony, oil, medical, drug, food, agriculture, education, and many others. Integrated circuits such as DSPs, amplifiers, DRAMs, SRAMs, EPROMs, EEPROMs, Flash memories, microprocessors, ASICs, and programmable logic are used in many applications such as computers, networking, telecommunications, and consumer electronics.

Consumers continue to demand greater performance in their electronic products. For example, higher speed computers will provide higher speed graphics for multimedia applications or development. Higher speed Internet web servers will lead to greater on-line commerce including on-line stock trading, book sales, auctions, and grocery shopping, just to name a few examples. Higher performance integrated circuits will improve the performance of the products in which they are incorporated.

Large modern-day integrated circuits have millions of devices including gates and transistors and are very complex. As process technology improves, more and more devices may be fabricated on a single integrated circuit, so integrated circuits will continue to become even more complex with time. To meet the challenges of building more complex and higher performance integrated circuits, software tools are used. These tools are in an area commonly referred to as computer aided design (CAD), computer aided engineering (CAE), or electronic design automation (EDA). There is a constant need to improve these electronic automatic tools in order to address the desire to for higher integration and better performance in integrated circuits.

An integrated circuit may be specified using a netlist and a layout. The netlist provides information about devices or components of the integrated circuit and their connectivity. The integrated circuit layout or integrated circuit mask layout is the representation of an integrated circuit in terms of planar geometric shapes, patterns, and features that correspond to shapes used in a masks to fabricate the circuit. A design engineer or mask designer may create the layout the integrated circuit. Some features in the layout or certain masks may be automatically generated.

In a typical layout, there are a very large number of shapes, patterns, and features. It is sometimes desirable to search for and find specific shapes, patterns, or features. For example, certain layout shapes, patterns, or features may cause electrical or design rule violations. It may be desirable that certain layout features have a more efficient or different layout. Hence, there are numerous reasons to be able to specify and find patterns in a layout and replace these patterns with other more preferable patterns. It is also desirable that a user can easily define or specify the pattern or patterns to search for, and their proposed replacement patterns.

Therefore, there is a need for improved techniques for pattern matching and pattern replacement in a layout.

BRIEF SUMMARY OF THE INVENTION

The invention provides a system and technique to specify patterns to search for in an integrated circuit layout, and specify proposed replacement patterns. A description file includes specifications for one or more patterns to be searched for. In the description file, for each pattern, there may be one or more proposed replacement patterns. The description file is read. Pattern matches, if any, in a layout are found. A proposed replacement pattern is tested in place of a matched pattern. If acceptable, the proposed pattern may be used to replace the matched pattern.

In an embodiment, invention provides a method including reading a description file having a number of pattern definitions, each described using a sequence of tokens of a pattern description language. The pattern definitions are stored in a memory of a computer. The patterns may be stored in an array or other data structure. Using the computer, a layout feature is checked against the pattern definitions to find any pattern matches. The description file may also include for each pattern definition, a description for at least one pattern replacement proposal description. When a layout feature is matched, it may be replaced with one of the proposals corresponding to the feature that is matched.

The pattern description language may include a first token describing a track in a first direction, a second token describing a track in a second direction, a third token describing a track in a third direction, a fourth token describing a track in a fourth direction, wherein the first and second directions are orthogonal to the third and fourth directions. Alternatively, the first and second tokens may be features extending in the same direction, such as two colinear tracks. The pattern description language may include a first token describing a track in a first or a second direction, and a second token describing a track in a third or a fourth direction, wherein the first and second directions are orthogonal to the third and fourth directions. There may be a token to describe a via. There may be a token to describe a T junction or termination point. There may be a token to indicate a relative priority of one pattern to other patterns.

In an embodiment, invention provides storing data structures, each data structure including a pattern definition section having a description of a pattern to be searched for in circuit layout database. A pattern proposal section includes a description of at least one proposed replacement pattern for the pattern described in the pattern definition section. The data structure may further include a priority definition section, describing a relative priority of a data structure to other data structures on the computer-readable medium. The pattern definition section may include a field to describe the pattern using a sequence of alphanumeric characters indicating a characteristic of the pattern to be searched for.

In an embodiment, invention provides a system including a storage device, a memory, and a processor. The processor is programmed to read a description file, stored on the storage device. The description file includes pattern definitions, each described using a sequence of tokens of a pattern description language. The processor loads the pattern definitions into the memory, and checks a circuit layout feature against each of the pattern definitions to find any pattern matches.

Furthermore, the processor may be programmed to edit the description file to add a new pattern definition to the plurality of pattern definitions. The processor may after adding the new pattern definition, check the circuit layout feature against each of the pattern definitions, including the new pattern definition, to find any pattern matches. The processor may for a pattern match and the circuit layout feature is an interconnect track of width X, replace circuit layout feature with a interconnect track of width Y, where Y is greater than X. In an alternative implementation, Y may be less than X, or any other desired relationship. Therefore, the technique can widen tracks or narrow tracks as needed. And the technique may be applied to layout features other than tracks.

Furthermore, the technique may move any circuit layout feature from an original position to a new position. This may be done by removing the circuit layout feature and replacing with a replacement circuit layout feature in a different position. The circuit layout feature may be a via, contact, interconnect track, or any other feature in a layout. An example of an application is to move a particular track to a new position. The new position may be anywhere in relation to the original position, such as to the right, left, above, or below.

In an embodiment, invention provides a graphical user interface having windowing capability. There is a first window or portion of a screen for editing a description file including a plurality of pattern definitions, each described using a sequence of tokens of a pattern description language, and at least one pattern replacement proposal description. There is a second window or portion of a screen for displaying results of a check of a layout feature against the plurality of pattern definitions to find any pattern matches.

In an embodiment, invention provides a method including permitting editing of a description file to add a new pattern definition to a number of preexisting pattern definitions. A software program is provided to read the description file after a new pattern definition has been added. The software program checks a circuit layout feature against each of the preexisting pattern definitions and the new pattern definition to find any pattern matches. The circuit layout feature that is checked may be output from an automatic router, such as automatically generated interconnect tracks.

Other objects, features, and advantages of the present invention will become apparent upon consideration of the following detailed description and the accompanying drawings, in which like reference designations represent like features throughout the figures.

DETAILED DESCRIPTION OF THE INVENTION

Figure 1:
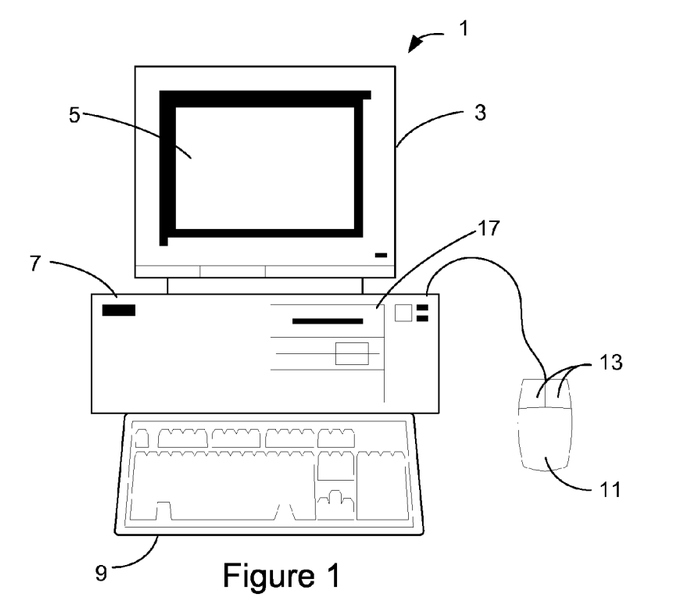
FIG. 1 shows a system of the present invention for performing electronic circuit design, including automatic interconnect routing according to parasitic constraint rules.

FIG. 1 shows an electronic design automation (EDA) system of the present invention for designing an electronic circuit or integrated circuit, including automatic routing of nets of the circuit. In an embodiment, the invention is software that executes on a computer workstation system, such as shown in FIG. 1. FIG. 1 shows a computer system 1 that includes a monitor 3, screen 5, cabinet 7, keyboard 9, and mouse 11. Mouse 11 may have one or more buttons such as mouse buttons 13. Cabinet 7 houses familiar computer components, some of which are not shown, such as a processor, memory, mass storage devices 17, and the like. Mass storage devices 17 may include mass disk drives, floppy disks, Iomega ZIP™ disks, magnetic disks, fixed disks, hard disks, CD-ROMs, recordable CDs, DVDs, recordable DVDs, Flash and other nonvolatile solid-state storage, tape storage, reader, and other similar media, and combinations of these. A binary, machine-executable version, of the software of the present invention may be stored or reside on mass storage devices 17. Furthermore, the source code of the software of the present invention may also be stored or reside on mass storage devices 17 (e.g., magnetic disk, tape, CD-ROM, or DVD).

Figure 2:
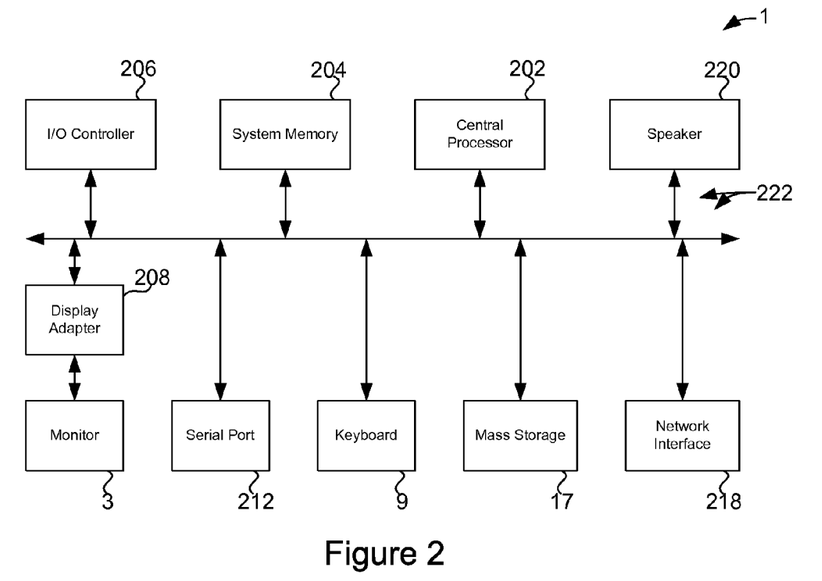
FIG. 2 shows a simplified system block diagram of computer system 1 used to execute the software of the present invention.

Further, FIG. 2 shows a system block diagram of computer system 1 used to execute software of the present invention. As in FIG. 1, computer system 1 includes monitor 3, keyboard 9, and mass storage devices 17. Computer system 1 further includes subsystems such as central processor 202, system memory 204, input/output (I/O) controller 206, display adapter 208, serial or universal serial bus (USB) port 212, network interface 218, and speaker 220. The invention may also be used with computer systems with additional or fewer subsystems. For example, a computer system could include more than one processor 202 (i.e., a multiprocessor system) or the system may include a cache memory.

Arrows such as 222 represent the system bus architecture of computer system 1. However, these arrows are illustrative of any interconnection scheme serving to link the subsystems. For example, speaker 220 could be connected to the other subsystems through a port or have an internal direct connection to central processor 202. Computer system 1 shown in FIG. 1 is but an example of a computer system suitable for use with the present invention. Other configurations of subsystems suitable for use with the present invention will be readily apparent to one of ordinary skill in the art.

Computer software products may be written in any of various suitable programming languages, such as C, C++, Pascal, Fortran, Perl, MatLab (from MathWorks, www.mathworks.com), SAS, SPSS, and Java. The computer software product may be an independent application with data input and data display modules. Alternatively, the computer software products may be classes that may be instantiated as distributed objects. The computer software products may also be component software such as Java Beans (from Sun Microsystems) or Enterprise Java Beans (EJB from Sun Microsystems). An operating system for the system may be one of the Microsoft Windows® family of operating systems (e.g., Windows 95, 98, Me, Windows NT, Windows 2000, Windows XP), Linux, UNIX, or Sun OS. Other operating systems may be used.

Furthermore, the computer may be connected to a network and may interface to other computers using this network. For example, each computer in the network may perform part of the task of the many series of automatic routing steps in parallel. Furthermore, the network may be an intranet, internet, or the Internet, among others. The network may be a wired network (e.g., using copper), telephone network, packet network, an optical network (e.g., using optical fiber), or a wireless network, or any combination thereof. For example, data and other information may be passed between the computer and components (or steps) of a system of the invention using a wireless network using a protocol such as Wi-Fi (IEEE standards 802.11, 802.11a, 802.11b, 802.11e, 802.11g, 802.11i, and 802.11n, just to name a few examples). For example, signals from a computer may be transferred, at least in part, wirelessly to components or other computers.

Figure 3:
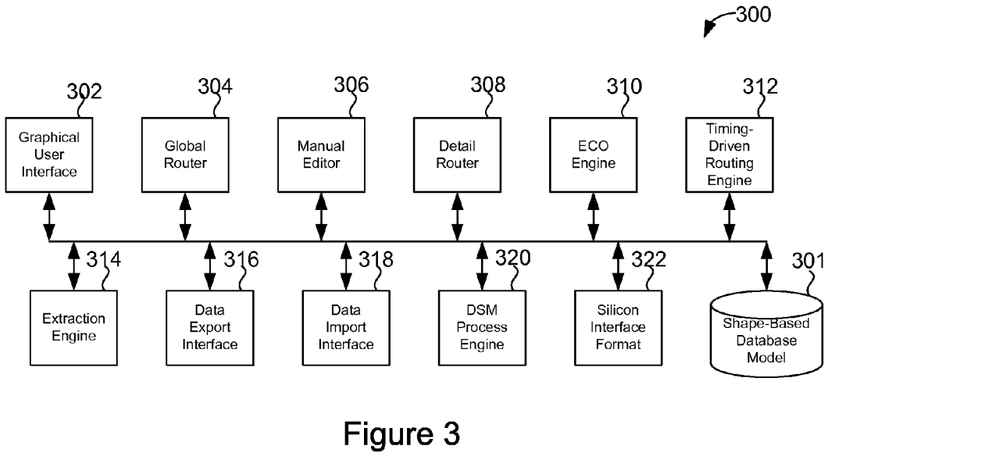
FIG. 3 shows a simplified functional block diagram of an exemplary EDA system incorporating aspects of the present invention.

FIG. 3 shows a simplified functional block diagram of an exemplary EDA system 300 incorporating aspects of the present invention. The EDA system includes a number of software tools, any of which may access a shaped-based database model 301 containing an integrated circuit design, or one or more portions of an integrated circuit design. The EDA system provides such tools as a graphical user interface 302, global router 304, manual editor 306, detail router 308, engineering change order (ECO) engine 310, timing-driven routing engine 312, extraction engine 314, data export interface 318, DSM process engine 320, and silicon interface format 322. An EDA system may include any number of the system tools shown in FIG. 3, and in any combination. Further, the EDA system may include additional tools not shown in FIG. 3.

An EDA system may be a grid-based system or shape-based system. A grid-based system relies heavily on the concept of a grid and routing grids. Gridded modeling, however, becomes difficult to implement successfully as the routing and feature sizes become smaller. The amount of data increases according to a square law, which means that tasks become increasingly more computationally complex and time-consuming as the amount of data increase. As feature sizes in integrated circuits continue to shrink, more features or geometries may be fitted into the same unit area of an integrated circuit. Therefore, it is important for an EDA system to handle increasingly complex integrated circuits and provide output or results quickly.

The techniques of the invention are especially suited for a shaped-based system, which may also be referred to as a gridless system. A shape-based system has no defined cell size. Each cell, or expansion area, is as large as possible. In brief, a shape-based system can expand edges, which means that an edge of an enclosing rectangle (or other polygon) may be expanded in the direction of the edge as far as desired until the edge finds an obstacle. This may be referred to as a "flood" operation. The rectangle may be representative of any polygon of the integrated circuit, such as a net, contact, via, transistor gate, or transistor active area. Blocked edges are edges that cannot be extended because they are blocked by a perimeter of another rectangle, such as another segment, net, or obstacle. Once an obstacle is encountered, then a shape-based approach floods around the obstacle—making a ninety degree or other angle (any angle may be used such as 30 degrees, 35 degrees, 36 degrees, 42 degrees, 45 degrees, or 60 degrees) turns as needed to route around the obstacle.

Chip design, be it analog, custom or digital, will increasingly suffer from timing and signal integrity issues, and in particular crosstalk, as geometries continue to decrease and ever more fine wires are introduced. Gridded solutions are not flexible enough to resolve these issues, let alone achieve a high rate of routing completion. A high performance timing and crosstalk-driven routing solution will become a mandatory requirement in physical design. The grid-based approach offers fast routing but requires customization to handle off-grid connections and is inefficient for post-route timing and signal integrity optimizations. When net widths and spacings must be changed to reduce resistance or cross-talk, grid-based approaches waste space by moving nets to the next available grid and waste time by resorting to rip-up and re-route techniques. Gridded systems are not good at irregular intervals, irregular spacings, or routing things that do not fit onto a regular grid. The gridless approach easily handles off-grid connections and is efficient for post-route optimizations. In a shape-based or gridless system, the layout may be a gridless layout, which means there is no grid which structures or polygon of the layout are associated with.

In an embodiment, the structure of database 301 facilitates shape-based operations. For example, a structure of this database may include an obstacle tree having nodes and leaves containing the obstacles of an integrated circuit. This tree structure permits rapid determination of where obstacles are when doing operations on the database, such as routing nets.

A specific example of an electronic design automation system is the Lyric Physical Design Framework™, made by Pulsic Limited Lyric is a high performance auto-interactive IC physical design solution for analog, custom, digital, mixed-signal, embedded DRAM or SRAM, and system-on-chip (SoC) design. The system incorporates solutions for automatic placement, routing, full ECO capabilities, timing closure, signal integrity, and power routing. Another example of an EDA system is the Prelude Physical Design Framework™, also made by Pulsic Limited. Prelude is an ultra high capacity, high performance IC physical design solution for very large digital/ASIC designs, running into millions of nets and cells. Prelude incorporates solutions for ECO placement and routing, powered by a scalable architecture, using a true distributed computing environment.

In FIG. 3, the EDA system 300 includes one or more of the components discussed below, in any combination. One skilled in the art will recognize that one or more of components shown in FIG. 3 may not be required to practice specific aspects of present invention. For example, when DSM process engine 320 is omitted from system, the system could still perform automatic routing of interconnect, but without providing DRC checking capabilities.

A graphical user interface 302 provides users a graphical interface in which to perform operations on the integrated circuit design. For example, the user can view the integrated circuit using the graphical interface. The user may use the mouse and cursor to select a particular polygon or feature, such as a net. The user may expand or zoom into areas of the integrated circuit design.

A global router 304 is an automatic routing engine that coarsely routes interconnects of the integrated circuit, thus enabling large designs to be routed more rapidly and completely. The global router may also provide visual and quantitative analysis of the congestion in the design by highlighting problem areas that can be fixed by incremental adjustments to the floor plan. The global router is sometimes referred to as a coarse router because it provides generally the routes for the interconnect, and may work in conjunction with a detail router 308 (discussed below) to place the geometries of the interconnect.

A manual editor 306 is a shape-editing suite for creating or editing metal, keep-outs, routing areas, and the ability to partition a design into smaller areas. These areas can then be worked upon individually and can be recombined at a later stage to complete the design. Full on-line design rule checking (DRC) ensures that manual operations are completed error-free first time. Powerful tools automatically push-aside existing wiring to make way for new wires and semiautomatic routing tools quickly close down troublesome nets by allowing the user to guide the routing engine around complex areas of the design.

The detail router 308 is an automatic router that completes the wiring in a design by determining the specific routes for each interconnect. The detail router may complete a portion of the wiring for design, such as for sections or specified cells of the design, or may complete all the wiring of the design. The detail router may route starting from scratch or from partially completed routing. In an implementation, the global router determines the general route paths for the interconnect, and the detail router takes this routing information from the global router and puts in the physical detailed geometries of the tracks and vias.

An engineering change order (ECO) engine 310 provides a capability to handle late stage ECO changes. Every element of the design can be modeled incrementally, thus eliminating the need to ever restart the physical design, no matter what changes may need to be made from upstream or downstream processes in the design. ECO engine capabilities can include the ability to shove or push cells aside to make space for new or relocated instances, and the ability to drop groups of components and automatically find legal placement sites for them minimizing the disruption to the design. When pushing or pulling cells, the wires remain connected to the cells and the wires lengthen, shorten, and move as needed, if possible, to keep the connections. The detail router can then repair any violating interconnects and stitch-up any newly introduced interconnects, with minimum impact, ensuring circuit stability is never compromised.

A timing-driven routing engine 312 provides RC timing analysis of interconnects. Used in concert with the detail router, the timing engine can determine the path of least delay for critical nets. Furthermore, the timing engine, in concert with an extraction engine, can actively select a longer path with a lower associated delay (e.g., due to lower capacitance) in preference to a shorter but slower route.

An extraction engine 314 is provided. Utilizing a unified, high-speed RC extraction engine, the crosstalk functionality accurately calculates the coupling between victim and aggressor signals. This same technology is then used to identify potential problems, and automatically implements a DRC correct solution without changing the path of the signal unnecessarily. In addition, signal-to-signal (or within and between classes of signals) spacing can be applied, and fully controllable automatic shielding can be used to protect particularly sensitive signals. The user is provided with unprecedented control over the resistance and capacitance in the signal path. Again, using the advanced built-in RC extraction technology, the user can separately control path resistance and capacitance, which is particularly useful for analog and mixed signal design.

In an implementation, the global router and detail router are linked to the extraction engine. So, for example, when running, the global router or detail router, or both, can call the extraction engine to obtain RC extraction information. The global router, detail router, or both, may use the RC extraction information when creating the interconnect routes. For example, the detail router may obtain RC extraction info from the RC engine in order determine whether an interconnect route meets current density rules, and widen the interconnect width as needed. More details are discuss in U.S. patent application Ser. Nos. 10/709,843 and 10/709,844, both filed Jun. 1, 2004 and incorporated by reference.

In a specific embodiment, the Lyric internal RC extraction driven constraints manager has been enhanced to ensure matching on a per-layer basis as well as the whole net or subnet. There is an increasing requirement in today's designs to match length, time, resistance and capacitance across nets on a per-layer basis. This ensures total net constraints are met as before but also guarantees designated nets can match on a per-layer basis.

The tightly coupled, high-speed RC extraction engine is used both during routing (global router or detail router, or both) and for post-routing extraction to reach timing closure in record time. Integrated timing analysis and curative features enable the management of delay within the design; the matching of delays within and between multiple nets; the sharing of delay between many nets in a signal path; and reducing the delay in critical nets by minimizing resistance and capacitance. Intelligent lengthening increases the delay of the faster nets, preventing shoot-through.

The detail router can address current density issues in analog design, to help achieve an optimum routing result for the entire design, and save valuable design time. The current information which is used to drive this current density functionality may come from, for example, a front-end schematic engine or simulation engine. The router can automatically route a net at varying widths to guarantee sufficient track widths at every point in the topology of the net to carry all current requirements. DRC and process checking tools locate any insufficient width areas that may exist in any routing, including automatically generated routing, manual routing, and imported prerouting.

A data export interface 316 is provided so data of the EDA system 300 may be exported for other processes. For example, output from the EDA system may be passed through the export interface to other EDA systems or software tools provided by other manufacturers. The export interface would provide output in a form, format, or structure, acceptable by process or software tool which is being exported to.

A data import interface 318 provides the means to import data, such as a circuit layout, netlist, or design constraints. The data to be import may be in various formats including data saved from other EDA systems or software tools. In addition, the source of the data may be a database, floppy drive, tape, hard disk drive, CD-ROM, CD-R, CD-RW, DVD, or a device over a communication network. Some examples of import formats include text, ASCII, GDSII, SIF, and LEF/DEF.

A DSM process engine 320 is provided. The DSM process engine does design rule checking (DRC). Design rule checking locates and highlights where a design is breaking process design rules. For example, a design rule is the minimum spacing between metal lines (i.e., geometries on a specific layer). A design rule may be the minimum width of a metal line. A design rule may be a minimum polysilicon-to-diffusion spacing. There are many other design rules for a typical process. Some design rules are for checking geometries within a single layer, and some design rules are for checking geometries of two or more layers.

A silicon interface format 322 is provided, which in a specific implementation is an ASCII database format. However, in other implementations, other silicon interface formats may be used.

A user may design an integrated circuit using a system such as shown in FIG. 3. A representative flow for designing an integrated circuit is outlined in steps 1 to 8 below. Step 5 is further subdivided into three substeps.

Integrated Circuit Design Flow

1. Provide Circuit Specification
2. Create Circuit Design
3. Generate Netlist

4. Simulate Performance and Verify Functionality of Circuit Design
5. Generate Layout
   5a. Layout Devices
   5b. Connect Devices
   5c. Connect Blocks of Circuitry
6. Physical Verification and Design Checking
7. Create Masks
8. Fabricate Integrated Circuit Although the steps above are listed in a specific order, the steps may take place in any order, as desired and depending on the specific application. These are general steps that may be applied to designing an integrated circuit including custom, a gate array, standard cell, field programmable logic, microprocessor, digital signal processor, microcontroller, system-on-a-chip (SOC), memory, ASIC, mixed signal, analog, radio frequency (RF) or wireless, and others. There may be additional or other steps, which may replace one or more above steps. Certain steps may be repeated. For example, after generating a layout for a circuit design, the step of simulating performance and verifying functionality may be performed again. This time, the parasitic and RC considerations from the layout can be back-annotated into the netlist or circuit design, and the design simulated again. The results of this simulation will presumably be more accurate because more precise information is provided.

In step 1 of the flow, a circuit specification is provided. This is a specification or description of what the integrated circuit or circuit will do, and what the performance will be. For example, the integrated circuit may be a memory integrated circuit with particular address input pins and input-output (I/O) pins. Integrated circuit performance may be quantified terms in AC and DC performance. For example, AC performance refers to propagation delays, maximum clock frequency, clock-to-output delay, hold time, and other similar parameters. DC performance refers to maximum supply current, maximum and minimum supply voltage, output current drive, and other similar parameters.

In step 2, an engineer creates a circuit design that presumably will meet the circuit specification. This circuit design may include transistors, resistors, capacitors, and other electronic components. The engineer uses these electronic components as building blocks of the design, interconnecting them to achieve the desired functionality and performance. The engineer may make a custom design using electronic component building blocks or use a gate array, where the building blocks are sets of cells set by the gate array manufacturer. The design may be input using a graphical design tool such as schematic capture program, and any other design tool may be used. The circuit may be described using a high-level design language (HDL). These design tools will create a netlist (step 3) of the circuitry, which is a listing of the components of the devices and their interconnections.

During the design phase, the engineer simulates the performance and verifies the functionality of the circuitry (step 4). There are transistor and process models to model the components. Some simulation tools include Spice, which performs circuit simulation, and Verilog, which performs functional and timing verification. This is where the electrical information for current density routing is generated.

After deciding upon an initial circuit design, the engineer begins layout (step 5) of the circuitry. Layout refers to making the three-dimensional dispositions of the element and interconnections to make an integrated circuit. Making an integrated circuit is a layer by layer process. Some layers of an integrated circuit are diffusion, polysilicon, metal-1, metal-2, contact, via, and others. There may be multiple layers of the same material, but on different layers. For example, diffusion and polysilicon layers are used to make MOS transistors (step 5a). For example, metal-1 and metal-2 are two different layers, where metal-1 is below the metal-2 layers. These metal layers may be connected together using a via. Metal is typically used for interconnections (step 5b) and supplying power and ground to the devices.

Software tools may be used to help with the layout of the circuit, such as the automatic routing of interconnect (steps 5b and 5c). The interconnect may be between devices. Devices and circuitry may be grouped into blocks or cells having inputs and outputs. The interconnect may be between these blocks or cells (step 5b).

In step 6, after or while the layout is generated, the physical design is verified and checked. For example, some of these operations may include layout-versus-schematic (LVS) checking, electrical rule checking (ERC), design rule checking (DRC), layout simulation (especially for analog circuitry), power analysis, and timing analysis. Physical verification and design checking is often iterative. Based on the design check, a design engineer or user may make changes to the design or layout, or both and the design may be rechecked in order to make sure any areas of concern or design errors have been cleared.

The result of layout is data (e.g., provided in GDSII or other format) that is used to make the masks (step 7). The masks are used to fabricate the integrated circuit (step 8) using a photolithography process. Typically, there are many "copies" of the same integrated circuited fabricated on the same wafer. Each integrated circuit is a "die" on the wafer. Good dies are separated from the bad dies. The good dies are sawed and packaged. Packaging generally includes encapsulating the die in plastic or other material, and connecting pads of the integrated circuit to pins of the package, where the integrated circuit can be interfaced.

Figure 4:
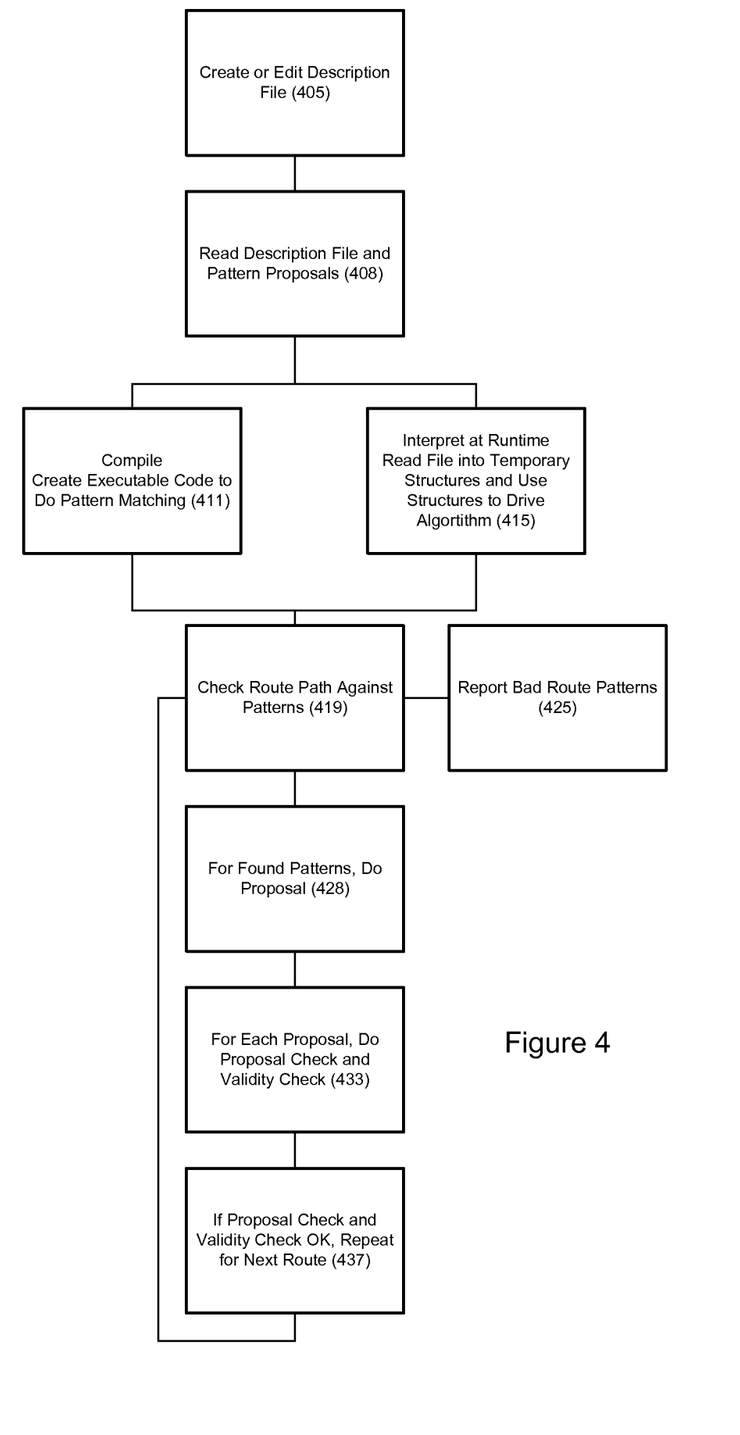
FIG. 4 shows a flow diagram of the invention.

FIG. 4 shows a flow diagram of a technique of pattern recognition and handling of the invention. The invention recognizes specific patterns in an integrated circuit layout and then has one or more proposals on how to replace these patterns with other patterns. The invention may be applicable to various aspects of integrated circuit design. One application is when performing automated routing, certain wires are routed in an "untidy" fashion. This technique may be used to replace those untidy wires with more tidy wires. A specific implementation of the invention is a PatternTidy™ tool by Pulsic Limited, which is part of the Lyric software package.

Another application is design for manufacturing (DFM) where the technique is used to mitigate optical proximity effects of certain geometries in the layout before integrated circuit fabrication. Certain patterns may cause problems during masking, and these patterns are replaced with more suitable patterns.

In step 405 of FIG. 4, description file is created or edited. The description file contains a listing of the patterns and one or more proposals for each of the patterns in a pattern description language. The pattern description language is analogous to a high-level programming language such as C++, Visual Basic, or others. As in a programming language, there are commands or tokens and parameters to be operated on. Sometimes the language syntax may be referred to as operators and operands. Table A below provides details of an exemplary format for description file and also describes tokens or commands used in the description file.

In other embodiment of the invention, other formats for the description may be used. The description file may be encrypted, if the tool provider does not want users to be able to view or alter the contents. However, the description file may be in standard text or ASCII format so the user can add or modify the operation of the tool. The user may be able to add or alter patterns that are to be recognized and their corresponding proposals. The tokens, commands, and other fields in the description file may be made up of one or more alphanumeric characters.

TABLE A

```
STARTPATTERN
# NAME = <pattern-name>              # a string with no spaces
# SEQUENCE = <pattern-sequence>      # the pattern to be matched - see below
# PRIORITY = <pattern-priority>      # lower number indicates a pattern will
#                                    # be preferred over patterns with a
#                                    # higher number
# STARTPROPOSAL
# NEWTRACK = <x1>,<y2>,<x2>,<y2>,<layer>   # Describes details of the proposed
#                                    # track. Each number refers to the
#                                    # segment whose value is to be used.
#                                    # i.e., a value of 1 for the x2 value
#                                    # would indicate that the first matched
#                                    # segment's starting x value should be
#                                    # used.
# NEWVIA = <x>,<y>,<layer1>,<layer2>    # Describes the details of the proposed
#                                    # via in a similar way to the track
#                                    # the layers are the starting layer
#                                    # of the specified segment
# DELETE = <segment>[,segment]       # a comma separated list of segments
#                                    # to be deleted
# ENDPROPOSAL
ENDPATTERN

# <pattern-sequence>     # This value can be made with any combination of the
#                        # following tokens:
#                        #
#                        # N - Matches a northwards track
#                        # S - Matches a southwards track
#                        # E - Matches a eastwards track
#                        # W - Matches a westwards track
#                        # X - Matches an X bias track
#                        # Y - Matches a Y bias track
#                        # J - Matches a T junction or termination point
#                        # V - Matches a via
#                        # * - Matches anything
#                        #
#                        # e.g., WNW - would describe a three segment staircase
#                        # pattern as follows:
#                        #
#                        #          333333333
#                        #                  2
#                        #                  2
#                        #                  2
#                        #                  11111111
```

Figure 5A:
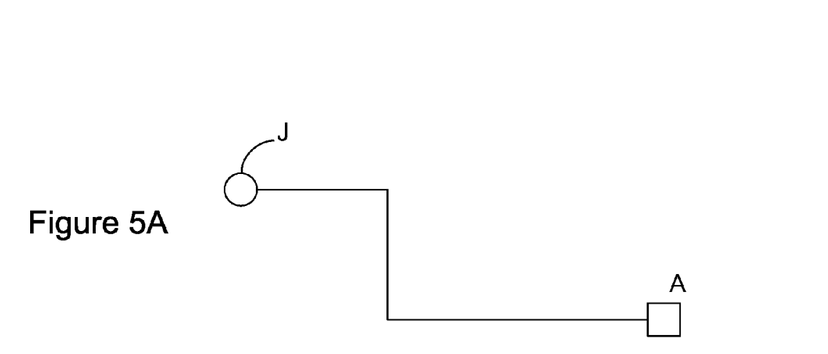
FIG. 5A shows an example of a termination point.
Figure 5B:
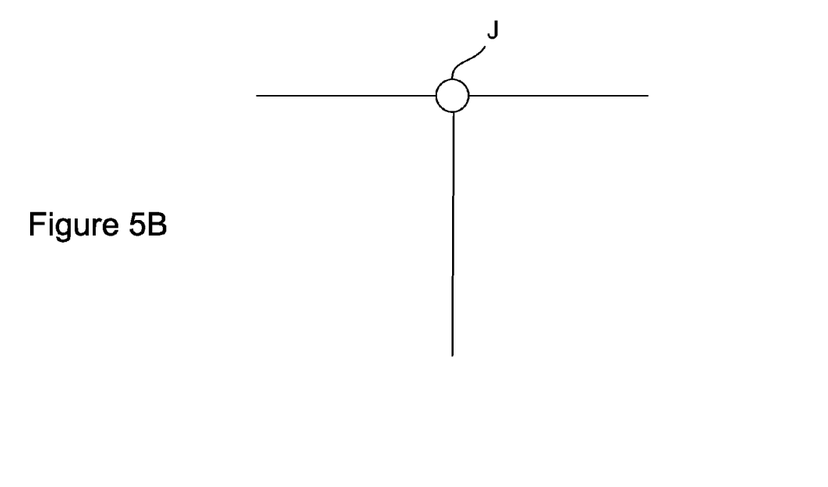
FIG. 5B shows an example of a T junction.

In table A above, N matches a northward track or segment. S matches a southward track or segment. E matches an eastward track or segment. W matches a westward track or segment. X matches an X bias track, which means a track either N or S. Y matches a Y bias track, which means a track either N or S. J matches a termination point or a T junction. FIGS. 5A and 5B show two examples of a J match. FIG. 5A shows a termination point, while 5B shows a T junction. V matches a via. An askterisk or "*" is a wild card symbol or token and matches anything.

Table B provides an example of an entry in the description file. This is for describing a "staircase" pattern and proposals of patterns for replacing the pattern. Essentially, this entry in the description file will, if possible, remove a "jog" from a staircase pattern.

TABLE B

```
STARTPATTERN
NAME = staircase
SEQUENCE = WNW*
PRIORITY = 0
STARTPROPOSAL
```

TABLE B-continued

```
NEWTRACK = 1,1,1,4,1
NEWTRACK = 1,4,4,4,1
    DELETE = 1,2,3
ENDPROPOSAL
STARTPROPOSAL
NEWTRACK = 1,1,4,1,1
NEWTRACK = 4,1,4,4,1
    DELETE = 1,2,3
ENDPROPOSAL
ENDPATTERN
```

Figure 6A:
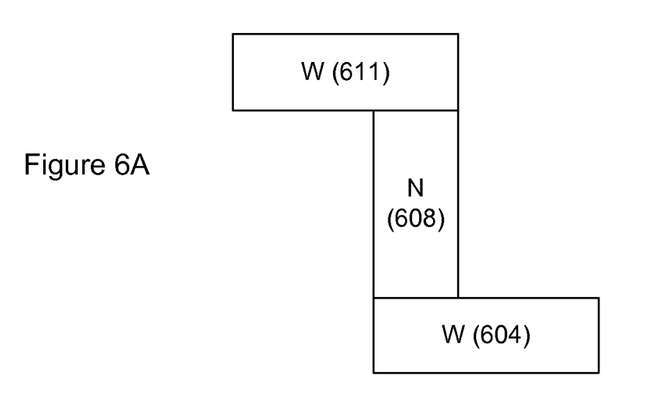
FIG. 6A shows a graphical representation of a staircase pattern.
Figures 6B, 6C:
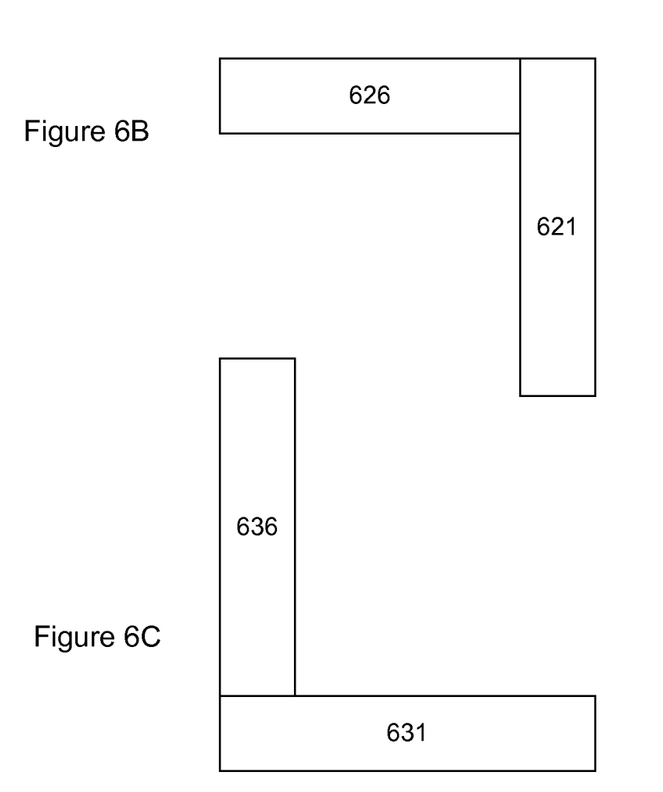
FIG. 6B shows a first proposal of a replacement track for a staircase pattern.
FIG. 6C shows a second proposal of a replacement track for a staircase pattern.

FIG. 6A shows a graphical representation of the WNW* or staircase pattern. There is a west segment 604, north segment 608, and west segment 611. The * means the remainder of the track pattern does not matter. FIG. 6B shows a first proposal (from top to bottom of the description), a track 621 from coordinates (1, 1) to (1, 4) and a track 626 from coordinates (1, 4) to (4, 4). FIG. 6C shows a second proposal, a track 631 from coordinates (1, 1) to (4, 1) and a track 636 from coordinates (4, 1) to (4, 4).

Returning to FIG. 4, in step 408, the description file with its patterns and proposals is read. Typically the file is read by a computer system for processing. Processing may be, as in step 411, by way of compiling the description file into executable code to perform the pattern matching. If security and maintaining secrecy is a concern, converting the description file into executable code will make it harder for any person to view what is in the file.

Alternatively, as in step 415, the description file may be read into temporary structures, such as in memory of a computer, and then these drive the algorithm. In an embodiment, the patterns are read into an array of patterns, which will be stored in the computer member. Step 415 may be thought of as an interpreted approach. An advantage to this approach is that the description file may be modified, such as patterns or proposals added, removed, or changed, and the technique will allow performing of the subsequent steps (419, 425, 428, 433, and 437) without needing to recompile code. So, a user or other person may change the description file, and then have the subsequent steps executed immediately after the change.

If security is a concern, the description file may be encrypted, so the file may be changed by authorized personnel who are provided the encryption password. Some examples of authorized personnel may include the software provider, information services people at the user's site, or other people as desired.

These tools work by looking for particular untidy wire patterns and replacing them with tidier wire. Another approach is to look for untidy patterns that are hard coded into the application. However, a shortcoming of this approach is that extending the patterns requires further software development (e.g., programming in C++ and recompiling) of the application. This means that in practice only a limited number of patterns are improved because it is difficult to modify or add patterns as in the approach of the invention.

In an embodiment, the invention provides field extendable technology that could be applied to wire pattern improvement. Each time an engineer or potentially a user finds a pattern that was not improved when there was opportunity to do so, a new pattern can be easily added to the technology to recognize the situation and a number possible improved wire patterns proposed.

In step 419, a route path or the layout is checked against the patterns. Any layout feature such as diffusion, metal, polysilicon, contacts and vias, combinations of various layers, and route paths may be checked against the patterns. A route path may be interconnect or a track in an integrated circuit layout. In an embodiment, the route path may have been automatically generated by an automatic router, such as a spine router described in U.S. patent application Ser. No. 10/908,895, filed May 31, 2005, which is incorporated by reference.

In a typical description file, for each layout feature, there are many possible patterns to search for. There may be multiple patterns that match one particular route path or different portions of the particular route path. The patterns to search for in the layout may be referred to as undesirable patterns because these are the patterns which we wish to search for and replace. The proposed patterns may be referred to as desirable patterns. A goal is to replace an undesirable pattern with one of the desirable patterns.

As an example, one of the patterns to search for may be the staircase pattern described in table B. In an embodiment of the invention, one or more than one of the patterns in the description file may be checked against each route path or feature. For example, during step 419, a route path or a feature of the layout may be checked against all the patterns in the description file.

Furthermore, in an embodiment of the invention, during pattern checking, patterns are checked for multiple orientations at the same time. For example, the staircase pattern may occur in an X direction or a Y direction, or at various angles from X and Y, such as 45 and 60 degrees, or any combination of angles and orientations, during the same check. In an embodiment, the technique of the invention checks different orientations during the same pattern check. By checking multiple orientations at a time, this reduces the number of passes requested (e.g., from 120 passes down to 6 passes), thus speeding up the pattern recognition process.

One specific approach for checking patterns is to use a bit mask for each pattern at each stage. This bit mask may be any size, such as an 8-bit, 10-bit, or 12-bit bit mask. The bit mask may be used to keep track of which patterns and orientations have been checked and patterns that have been matched.

In an embodiment of the invention, multiple patterns are considered at one time and patterns that will not match can be removed from further consideration. For example, perhaps twenty of sixty patterns in the description file start with the N token. Immediately after checking a first track in the sequence, if it is an N track, forty patterns may be removed from consideration. The next track in the layout feature may be a W track, and of the remaining twenty patterns, twelve may have W as the next sequence. And the process of checking patterns simultaneous continues in this fashion on the check of the layout feature is complete. The bit masks, described above, are adjusted as the check proceeds. This technique speeds up the pattern recognition task.

After pattern or route check 419, in an embodiment of the invention, a step 425 reports to the user the route paths (or layout geometries) that are matched. This may be in the form of a report of a location for each match or a graphical or visual indication of each match. Upon receiving the report, the user may be manually dress patterns as the user desires. This report check is optional and may be omitted. Whether a report is provided or not may be a user selectable option.

In another embodiment, processing continues to step 428, where for each pattern, proposals are performed for each match. Step 428 may be subsequent to the reporting step 425, or processing may be from step 419 to 428, where step 425 is omitted. Proposals are actions to perform or patterns used to replace the matched patterns.

In the description file, the proposals are listed between the STARTPROPOSAL and ENDPROPOSAL tokens. There may be one proposal or multiple proposals. If there are multiple proposals, proposals may be considered in order they are listed, or there may be another technique or arbitrating the order in which to handle proposals.

Table A provides an example of some proposal tokens, NEWTRACK, NEWVIA, and DELETE. These are described in detail in table A. The NEWTRACK token described a new track. The NEWVIA token describes a new via. The DELETE token deletes track segments to be deleted. Table A is provided as an example of an example of a pattern and proposal (or remedy) description language. In other embodiments of the invention, another language or similar language may be used. The language may include different tokens or additional tokens with additional functionality.

For example, there may be a token such as MOVETRACK for a move track or move layout feature command or operation, which moves a track to a new position. In an embodiment, a move operation may move the track in a particular direction until the track touches an obstacle. This will give a bound of how far the track can move, and the track can be moved anywhere from its initial position until it touches an obstacle.

Another example of a command or operation is an arithmetic operation or arithmetic operations. Arithmetic operations may include addition, subtraction, multiplication, division, and other function, which may include combinations of the arithmetic operations. These arithmetic operations may be used to operate on a layout feature or track. For example, these may be used in connection with a move track operation, so that a track or layout feature may be moved in a +K way, where K is a constant.

As a further example of a command or operation is widen, which is used to widen a layout feature or track. The widen command may be used in conjunction with an arithmetic operation command. Widen may be useful to widen tracks that are too narrow. Furthermore, the widen command may be used in design for manufacturing to overcome or compensate for optical proximity effects. As an example, in operation, a particular layout feature may match a particular pattern in the description file. This pattern may have problems due to optical proximity effects during lithography or other processing. For example, a part of the layout feature may become too narrow, and could possible become and open circuit. In order to remedy this situation, a proposal in the description file for this pattern is to widen the layout feature to compensate for the optical proximity effect. Then even after the resulting, the layout feature will have sufficient width.

Further, in an embodiment of the invention, there may be a command or operation to narrow a track. This may be useful to compact a layout, where it is determined that a particular track or interconnect will be carrying lower current signals, such as a logic signal.

FIGS. 6B and 6C show proposals listed in table B. In the case of table B, the staircase pattern with two ninety-degree turns is replaced with a pattern having the same connectivity and one ninety-degree turn. There are two possible replacement patterns. The proposals are generally to be improvements in some way over the matched pattern. In the case of design for manufacturing, the proposed patterns may reduce optical proximity effects.

There is a possibility two or more of the patterns in the description file may match a layout geometry or structure at one time. Then there can be a conflict of which matched patter to address first in step 428. Such a conflict can be handled by using the PRIORITY token. For example, in table B, the priority is set to 0. Other priorities may be 1, 2, 3, and so forth. In an embodiment, the pattern match with the lower assigned priority will take priority over higher assigned priorities. Alternatively, a scheme may be used where the higher assigned priority is acted on first. In the case the priorities of the pattern matches are the same, then one technique is just to choose any of the pattern matches to use, the pattern match which is closer to the top of the description file, or any other arbitrary technique.

A step 433 performs a proposal check and validity check. The proposal check determines whether a proposal is a viable solution or replacement for the matched pattern. For example, the proposal check passes when the replacement pattern or proposed pattern may be used without causing problems. The proposal check does not pass when the proposed pattern touches an obstacle, object, or another geometry. The validity check determines which patterns are still valid or matched.

In step 433, when a particular proposal does not pass the check, then the next proposal is checked. The checking of the proposals continues for each proposal until a proposal does pass the validity check. There can be any number of proposals. If after going through every proposal, none of the proposals pass the validity check. Then the original pattern or geometry is placed back.

For example, if there are two proposals and the first proposal passes the validity check, the first proposal may be use. If the first proposal does not pass, but the second proposal passes, the second proposal may be used. If both the first and second proposals do not pass, then the original layout feature may be used or put back in place. As has been discussed, proposals may be implemented in any order. An order may be from the top of a file including such proposals and working down toward the bottom or end of the file.

The techniques of the invention such as the above validity checks may be performed using the provided layout feature or using a copy of the layout feature. For example, software implementing a method of the invention may make a duplicate of the layout feature for checking of the various proposals. This duplicate may be stored in memory, disk, or another other storage location. This storage location may be temporary storage that is used to perform pattern checking or pattern evaluation. Actions may be performed using the duplicate instead of the original. Then, the provided layout may be modified after checking proposals on the duplicate layout feature first.

If the proposal check and validity check pass in step 437, then go to the next route (or geometry or layout feature) to check against the patterns. And the above process continues to repeat until all or the selected route paths or patterns in a given block or layout are checked.

Table C below provides pseudocode for a specific implementation of the invention. In an embodiment, the invention is implemented using the C++ programming language. Other programming may be used. This pseudocode is provided merely as an example of one implementation of the invention. There may be other approaches or implementations of the invention. For example, the description may be described in a format different from PXYXP. The patterns may be stored in another data structure other than an array, such as a linked list. Each pattern may be represented by an n-bit number, where n can be any integer.

The pseudocode provides an implementation for finding and correcting or improving layout of nets in an integrated circuit. This implementation may be used to check automatically generated interconnect. However, the invention may be applied to other pattern matching and replacement in integrated circuit layout. For example, the invention may be used in design for manufacturing and optical proximity checking and adjustment. The invention may be used to correct electrical and design rule violations, or adjusting a layout to meet certain parameters. The invention may be used in connection with engineering change orders. For example, the invention may be used to aid in the creation of a higher power version of an integrated circuit, where certain power lines are to be widened. The invention may be used to shrink or other make more compact an integrated circuit layout.

TABLE C

For a given number of passes and while any net's wiring was improved
{
  For each net to be tidied
  {
    Use a previously created connectivity model of the net (i.e., what is connected to what) to walk along the path from each endpoint (e.g., pin) to each other endpoint.
    {
      Create a description of the items in the path in order as a string e.g., Pin, Xtrack, Ytrack, Xtrack, Pin would be described as PXYXP
      Initialize a pipeline of pattern matching stages as long as the string-each stage represents a possible starting point for a matched pattern. Each stage contains an array active patterns.
        The pipeline active pattern array is initially set so that all patterns

TABLE C-continued

```
are active. Each pattern is represented by a single 8-bit number.
    for each step in the path (i.e., each letter in the string)
    {
        start a new stage with an offset of 0 and add to an
accumulating list of active stages
        for each active stage
        {
            for each pattern
            {
                evaluate the pattern for this stage by
applying the expected pattern segment at the stage's offset to the found
path segment using the vector table
                store the resulting 8 bit number in the active
pattern array.
                if the end of any pattern is reached and it is
still active (i.e. the number is non zero) attempt the proposals.
            }
            If no more patterns are active in the stages's active
pattern array then discard it.
            increment the offset value for the stage.
        }
    }
}
}
```

A description file may include any number of patterns and proposals. Each pattern has associated with it one or more related proposals. Some examples of what may be included in a description file include patterns to search for including staircase, loopback, vialoopback1, vialoopback2, jumper, colinear, colinear_loopback, cornervia, and viastaircase. The description file also includes proposed replacement patterns. A description file may have any combination of the patterns. Additional patterns may be added or patterns may be altered. To be sure, a user may edit the description file and change, remove, or add patterns or proposals, or both. The description file may use one particular format and syntax, but other formats and syntax may be used.

In an embodiment, a description file is read each time the tool is run and therefore can be edited between runs. An application engineer, for example, with a particular wire pattern that needs improving can edit the file to tell the tool how to recognize it and how to improve it. If a user has a particular routing pattern they want to achieve, the user can use the technology of the invention to do that.

This description of the invention has been presented for the purposes of illustration and description. It is not intended to be exhaustive or to limit the invention to the precise form described, and many modifications and variations are possible in light of the teaching above. The embodiments were chosen and described in order to best explain the principles of the invention and its practical applications. This description will enable others skilled in the art to best utilize and practice the invention in various embodiments and with various modifications as are suited to a particular use. The scope of the invention is defined by the following claims.

The invention claimed is:

1. A method comprising:
   reading a description file comprising a plurality of pattern definitions for layout features, each described using a sequence of tokens of a pattern description language, wherein the description file comprises pattern-to-be-matched sequence specified using a plurality of tokens, and the plurality of tokens comprises a first token to indicate a track in a first direction, a second token to indicate a track in a second direction, opposite of the first direction, a third token to indicate a track in a third direction, perpendicular to the first direction, and a fourth token to indicate a track in a fourth direction, opposite of the third direction;
   storing the plurality of pattern definitions in a memory; and
   using at least one processor, checking a layout feature of a layout against the plurality of pattern definitions to find any pattern matches.

2. The method of claim 1 wherein the memory comprises nonvolatile memory, and a fourth token to indicate a track in a fourth direction, opposite of the third direction.

3. The method of claim 1 wherein the plurality of tokens comprises a fifth token to indicate an X bias track.

4. The method of claim 1 wherein the plurality of tokens comprises a sixth token to indicate a Y bias track.

5. The method of claim 1 wherein the plurality of tokens comprises a seventh token to indicate a T junction.

6. The method of claim 1 wherein the plurality of tokens comprises an eighth token to indicate a via.

7. The method of claim 1 wherein the plurality of tokens comprises a ninth token to indicate a wild card.

8. The method of claim 1 wherein an order of the plurality of tokens indicates an order of a sequence of a pattern to be matched.

9. The method of claim 1 wherein the description file comprises a first proposed-track token followed by a second proposed-track token in sequence, the first proposed-track token describes an first proposed track starting from an initial position and ending at an end position, and the second proposed-track token in sequence describes a second track starting from the end position of the first track.

10. The method of claim 1 wherein the description file comprises a proposed-via token, describing a proposed via starting from a starting layer and ending at an ending layer.

11. The method of claim 1 wherein the description file comprises a delete-segment token, describing at least one segment to be deleted.

12. The method of claim 1 comprising:
    specifying the description file using ASCII.

13. A graphical user interface comprising:
    a first screen for specifying an description file comprising a plurality of pattern definitions, each described using a sequence of tokens of a pattern description language, a token in the sequence describing a segment of a pattern definition relative to a previous token in the sequence, and at least one pattern replacement proposal description wherein a first token of the pattern description language indicates a track in a first direction, a second token indicates a track in a second direction, opposite of the first direction, a third token indicates a track in a third direction, perpendicular to the first direction, and a fourth token indicates a track in a fourth direction, opposite of the third direction; and
    a second screen for displaying results in a graphical representation of a check of a layout feature against the plurality of pattern definitions to find any pattern matches.

14. The graphical user interface of claim 13 wherein the description file is represented in ASCII.

15. The graphical user interface of claim 13 wherein upon adding an alphanumeric token to the sequence in the first screen, the graphical representation of a pattern match in the second screen comprises an additional track segment.

16. The graphical user interface of claim 13 wherein the first screen is in a first window, and the second screen is in a second window.

17. The method comprising:
    reading a description file comprising a plurality of pattern definitions, each described using a sequence of tokens of a pattern description language, a token in the sequence describing a feature of a pattern definition relative to a previous token in the sequence, and at least one pattern replacement proposal description wherein a first token of the pattern description language indicates a track in a first direction, a second token indicates a track in a second direction, opposite of the first direction, a third token indicates a track in a third direction, perpendicular to the first direction, and a fourth token indicates a track in a fourth direction, opposite of the third direction; and using at least one processor, checking a layout feature against the plurality of pattern definitions to find any pattern matches.

18. The method of claim 17 comprising:

displaying results in a graphical representation of the check of a layout feature against the plurality of pattern definitions to find any pattern matches.

19. The method of claim 17 wherein a token of the pattern description language describes a feature between layers.

20. The method of claim 17 wherein the description file is represented in ASCII.

* * * * *